United States Patent [19]

Stenbock

[11] Patent Number: 4,562,362
[45] Date of Patent: Dec. 31, 1985

[54] AUTOMATIC TRIGGER SENSITIVITY ADJUSTMENT CIRCUIT

[75] Inventor: Roger M. Stenbock, Canby, Oreg.

[73] Assignee: Tektronix, Inc., Beaverton, Oreg.

[21] Appl. No.: 434,819

[22] Filed: Oct. 18, 1982

[51] Int. Cl.[4] .......................................... H03K 3/295
[52] U.S. Cl. .................................. 307/290; 307/359
[58] Field of Search ................... 307/290, 296 R, 297, 307/351, 358, 359; 330/59, 86, 282

[56] References Cited

U.S. PATENT DOCUMENTS 4,030,034 6/1977 Ruegg ..................................... 330/59
4,045,687 8/1977 Maringer .............................. 307/358

FOREIGN PATENT DOCUMENTS 169408 12/1981 Japan ................................... 330/282

Primary Examiner—John Zazworsky
Attorney, Agent, or Firm—Allston L. Jones; George T. Noe

[57] ABSTRACT

A novel Schmitt trigger circuit is disclosed in which the hysteresis is increased in response to low amplitude input signals and decreased for high amplitude input signals. The result is a trigger circuit which can automatically optimize trigger detection for an oscilloscope or counter in the presence of noise on the input signal.

12 Claims, 1 Drawing Figure

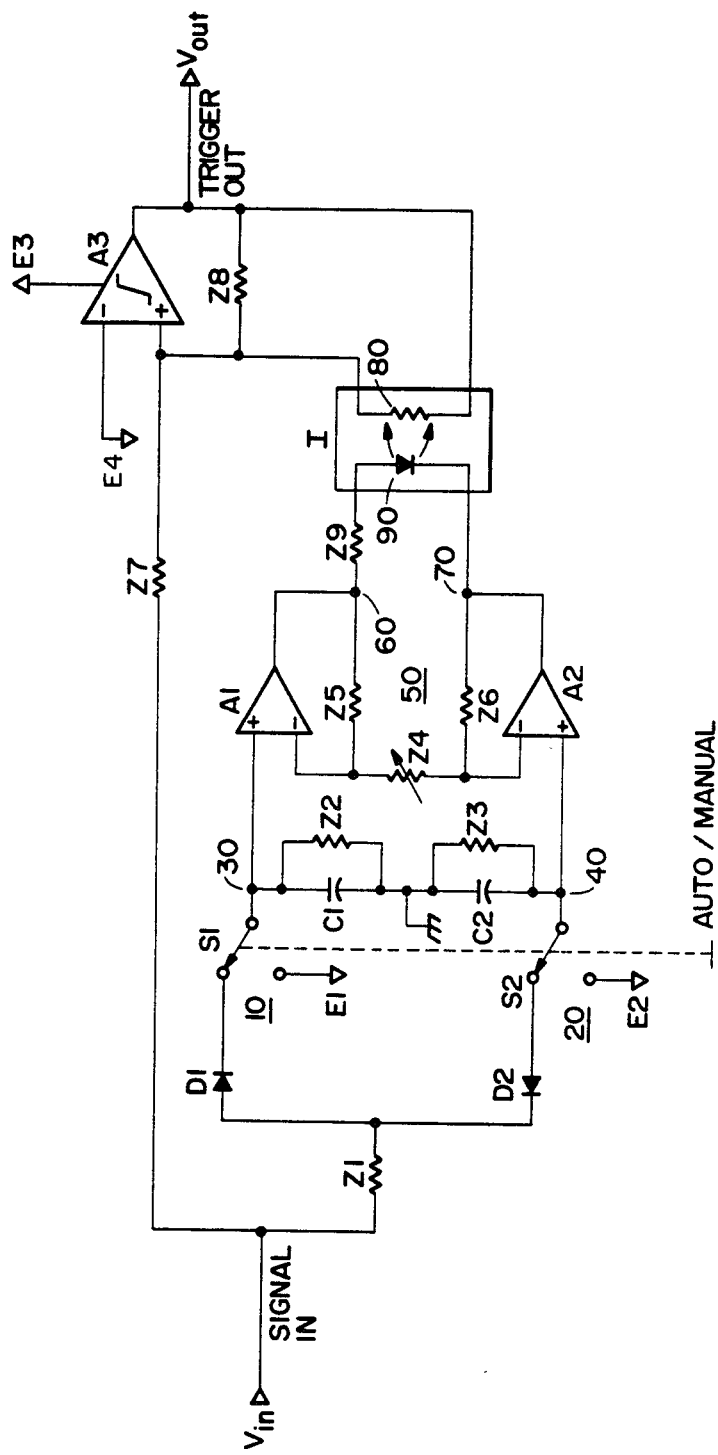

AUTOMATIC TRIGGER SENSITIVITY ADJUSTMENT CIRCUIT

BACKGROUND OF THE INVENTION

Many types of electronic measuring instruments, such as oscilloscopes and counters, require an input trigger signal to begin their measuring sequence. Normally, the trigger signal is generated by detecting the voltage at which an AC signal to be measured crosses a reference level by means of a high gain amplifier. Since all signals have some superimposed noise, it is necessary to set the reference level high enough to prevent false trigger signals caused by the noise at the input to the high gain amplifier. Conventionally, this is accomplished by means of a Schmitt trigger type circuit which provides positive feedback, or hysteresis, in the high gain trigger signal generating amplifier. Such hysteresis helps to reduce the chance of multiple trigger signals as the noisy input signal crosses the reference level on the input of the trigger amplifier. If the trigger level is too low, the instrument may experience false triggers caused by the noise resulting in alternate slope triggering with the displayed signal flickering or the counter displaying various results.

However, the amount of hysteresis needed to prevent false triggering in the presence of noise usually requires a manual adjustment by the operator or during calibration so that the hysteresis need not be set so high as to miss the actual reference level crossing by the AC input signal.

Unfortunately, since the trigger hysteresis adjustment is done manually it is both an operator inconvenience and a potential source of expensive recalibration. It would be desirable, to have a trigger circuit which could automatically adjust its own hysteresis sensitivity as the signal level to be measured changes with low sensitivity for large signals and high sensitivity for small signals.

SUMMARY OF THE INVENTION

The present invention solves the problem of false triggering when noise of greater amplitude than the minimum trigger hysteresis is present on the AC input signal. The disclosed circuit will automatically adjust the hysteresis level of the Schmitt trigger circuit in a measuring instrument as the amplitude of the signal changes.

In most situations the desired trigger characteristic requires high sensitivity for low amplitude AC input signals and low sensitivity for high amplitude AC input signals. This invention accomodates this desire by automatically increasing the positive feedback of the Schmitt trigger circuit when the input signal amplitude is high, and automatically reducing the positive Schmitt trigger circuit feedback when the signal amplitude is low.

In addition, if a different characteristic is desired for the trigger circuit, then the disclosed circuit can readily be put under manual control. In the manual mode the hysteresis can be preset to trigger when the input signal exceeds an operator chosen value.

DETAILED DESCRIPTION OF THE DRAWINGS

The single FIGURE shows a circuit diagram of the preferred embodiment of the present invention.

DETAILED DESCRIPTION OF THE INVENTION

As shown in the single FIGURE of the drawing, the present circuit adjusts the hysteresis of a Schmitt trigger amplifier A3 as a function of the peak-to-peak amplitude of the AC input signal, $V_{in}$. Diode D1, resistor Z2, and capacitor C1 serve as a positive peak detector 10. Diode D2, resistor Z3, and capacitor C2 serve as a negative peak detector 20. The input signal, $V_{in}$, is applied to resistor Z1 which acts to buffer the impedance of the input signal, $V_{in}$, from the positive and negative peak detectors 10 and 20. The positive and negative voltage peaks of the input signal, $V_{in}$, are stored on capacitors C1 and C2 respectively, so that the voltage between points 30 and 40 is a DC voltage equivalent to the peak-to-peak value of the AC input signal, $V_{in}$. Resistors Z2 and Z3 are selected to slowly discharge capacitors C1 and C2 respectively, to permit the peak detectors 10 and 20 to gradually respond to decreases in the amplitude of the input signal, $V_{in}$.

The DC voltage from nodes 30 to 40 is the input to a differential amplifier 50 formed by operational amplifiers A1 and A2 having high impedance inputs and low impedance outputs with gain select resistors Z4, Z5, and Z6. Resistor Z4 is a variable resistor to balance the positive and negative differential gain of amplifier 50 and to provide for calibration necessary to accommodate component variations. The voltage between the output of operational amplifiers A1 at node 60 and operational amplifier A2 at node 70 is thus a buffered DC voltage proportional to the peak-to-peak AC input voltage, $V_{in}$.

The voltage between nodes 60 and 70 is then coupled so as to inversely change variable resistor 80 which is shown in the drawing as part of opto-isolator I. As illustrated in the drawing, the voltage between nodes 60 and 70 produces a current through serially connected resistor Z9 and light emitting diode (LED) 90. As the peak-to-peak input voltage, $V_{in}$, increases, the LED 90 becomes brighter. This causes light sensitive variable resistor 80 to decrease in resistance. Similarly, when the peak-to-peak input voltage, $V_{in}$, decreases, resistor 80 increases in resistance. Other means of producing voltage variable resistors, such as a FET, can also be used in place of opto-isolator I. However, opto-isolator I serves as an effective means to isolate the DC voltage between nodes 60 and 70 from the high frequency AC voltages present in the remainder of the circuit.

The hysteresis voltage of Schmitt trigger amplifier A3 is determined by the Schmitt trigger output voltage amplitude K, and the amount of the positive feedback set by input resistor Z7 and the parallel combination of feedback resistors Z8 and 80. Thus, if $Z_f$ is the parallel combination of resistors Z8 and 80, the hysteresis voltage H is described by the expression $$H = (Z7/Z_7 + Z_f)(K).$$

The Schmitt trigger amplifier A3 will provide an output signal change whenever the input signal, $V_{in}$, passes through a voltage level equivalent to reference voltage E4 plus the hysteresis level H. Thus, by decreasing the value of resistor 80, the effective feedback resistance, $Z_f$, is decreased and the hysteresis voltage, H, is increased. Increasing the hysteresis voltage, H, decreases the trigger sensitivity at $V_{out}$ and thus increases the immunity to noise on the input signal $V_{in}$.

For low amplitude input signals, $V_{in}$, the peak detector voltage between nodes 30 and 40 will be lower. This will cause the light sensitive resistor 80 to have a higher resistance, which in turn decreases the hysteresis voltage, H, of the Schmitt trigger amplifier A3 resulting in greater trigger sensitivity and decreased noise immunity.

In most cases the desired trigger characteristics permit a high sensitivity for low amplitude signals and low sensitivity for high amplitude signals as discussed above. However, if a different result is desired, manual control can be accomplished by setting switches S1 and S2 to reference voltages E1 and E2 respectively. The Schmitt trigger sensitivity is then no longer a function of the input signal amplitude, $V_{in}$, and the hysteresis voltage, H, can then be set manually by appropriately adjusting reference voltages E1 and E2.

I claim:

1. A circuit to automatically adjust the hysteresis in a Schmitt trigger amplifier having a positive feedback path including a feedback element, said hysteresis adjustment being responsive to the amplitude of an AC input signal, said circuit comprising:
a terminal means for receiving said AC input signal;
a first resistor coupled between said terminal means and the Schmitt amplifier;
an AC detector means coupled to the terminal means for producing a D.C. output signal proportional to the amplitude of the A.C. input signal; and
voltage variable impedance means coupled to the feedback element for altering the effective impedance of said positive feedback path in response to the D.C. output signal of said AC detector means.

2. A circuit as in claim 1 wherein said A.C. detector means comprises an A.C. detector.

3. A circuit as in claim 2 wherein said AC peak detector comprises:
a plurality of diodes coupled to receive the A.C. input signal; and
a plurality of capacitors coupled to the outputs of said diodes.

4. A circuit as in claim 3 wherein said AC peak detector further comprises:
an amplifier having low impedance output and high impedance input terminals coupled to the outputs of said plurality of diodes and capacitors.

5. A circuit as in claim 1 wherein the voltage variable impedance means is coupled in parallel with the positive feedback element.

6. A circuit as in claim 5 wherein the voltage variable impedance means comprises:
a light emitting diode coupled to the output of said AC detector means;
a second resistor connected in series with the light emitting diode to limit the current through said light emitting diode; and
a light sensitive resistor optically coupled to the light emitting diode.

7. A circuit as in claim 6 wherein the resistance of said light sensitive resistor varies inversely with the current through the light emitting diode.

8. A circuit as in claim 4 wherein the voltage variable impedance means is coupled in parallel with the positive feedback element.

9. A circuit as in claim 8 wherein the voltage variable impedance means comprises:
a light emitting diode coupled to the output of said amplifier;
a second resistor connected in series with the light emitting diode to limit the current through said light emitting diode; and
a light sensitive resistor optically coupled to the light emitting diode.

10. A Schmitt trigger circuit having adjustable triggering sensitivity, comprising:
an input terminal for receiving an input signal;
an amplifier having a first and a second input and an output, said first input being connected to a reference voltage source, said second input being coupled via an input impedance element to said input terminal, and said output being coupled via a positive feedback impedance path to said second input;
means for generating a hysteresis control voltage; and
voltage variable impedance means connected in said positive feedback impedance path and being responsive to said hysteresis control voltage for varying the effective impedance of said positive feedback impedance path, thereby adjusting triggering sensitivity.

11. A Schmitt trigger circuit in accordance with claim 10 wherein said means for generating a hysteresis control voltage includes peak detector means coupled to said input terminal for detecting both the positive and negative peak voltages of said input signal.

12. A Schmitt trigger circuit in accordance with claim 10 wherein said means for generating a hysteresis control voltage includes a second amplifier and means for selectively coupling one of said input signal and a pair of reference voltages to said second amplifier, said second amplifier producing across a pair of outputs thereof said hysteresis control voltage.

* * * * *